(12) United States Patent
Xu et al.

(10) Patent No.: US 10,090,907 B2
(45) Date of Patent: Oct. 2, 2018

(54) ANTENNA SWITCHING SYSTEM AND METHOD

(71) Applicant: Huawei Device (Dongguan) Co., Ltd., Dongguan (CN)

(72) Inventors: Qiuliang Xu, Shanghai (CN); Liping Yang, Shanghai (CN); Changfeng Zhang, Shanghai (CN); Zhijun Chen, Shanghai (CN)

(73) Assignee: Huawei Device (Dongguan) Co., Ltd., Dongguan (CN)

( * ) Notice: Subject to any disclaimer, the term of this patent is extended or adjusted under 35 U.S.C. 154(b) by 0 days.

(21) Appl. No.: 15/223,845

(22) Filed: Jul. 29, 2016

(65) Prior Publication Data

US 2016/0337025 A1 Nov. 17, 2016

Related U.S. Application Data

(63) Continuation of application No. PCT/CN2014/072142, filed on Feb. 17, 2014.

(51) Int. Cl.
*H01Q 5/378* (2015.01)
*H04B 5/00* (2006.01)
(Continued)

(52) U.S. Cl.
CPC ........... *H04B 7/0805* (2013.01); *H01Q 1/243* (2013.01); *H01Q 1/48* (2013.01); *H01Q 3/24* (2013.01);
(Continued)

(58) Field of Classification Search
CPC ........... H04B 1/005; H04B 5/00; H01Q 5/378
See application file for complete search history.

(56) References Cited

U.S. PATENT DOCUMENTS

| | | | | |
|---|---|---|---|---|
| 5,479,176 A | * | 12/1995 | Zavrel, Jr. | H01Q 3/242 342/374 |
| 5,854,986 A | * | 12/1998 | Dorren | H01Q 1/246 455/103 |

(Continued)

FOREIGN PATENT DOCUMENTS

| CN | 101309087 A | 11/2008 |
|---|---|---|
| CN | 101582539 A | 11/2009 |

(Continued)

OTHER PUBLICATIONS

3GPP TS 36.306 V11.3.0 (Mar. 2013); 3rd Generation Partnership Project; Technical Specification Group Radio Access Network; Evolved Universal Terrestrial Radio Access (E-UTRA); User Equipment (UE) radio access capabilities (Release 11); 27 pages.

(Continued)

*Primary Examiner* — Cindy Trandai
(74) *Attorney, Agent, or Firm* — Slater Matsil, LLP

(57) ABSTRACT

The present invention is applicable to the field of mobile terminals and provides an antenna switching system and method. The antenna switching system includes a radio-frequency transceiver circuit, a primary antenna, and a parasitic antenna, where the primary antenna is connected to the radio-frequency transceiver circuit, and further includes a switch circuit, configured to connect, when the parasitic antenna is used to receive or send a radio-frequency signal, the parasitic antenna and the radio-frequency transceiver circuit. If the parasitic antenna is grounded, the parasitic antenna may be configured to spread a spectrum. In addition, when carrier aggregation is needed, the parasitic antenna is connected to the radio-frequency transceiver circuit, so as to become an independent receive or transmit antenna.

20 Claims, 6 Drawing Sheets

(51) Int. Cl.
| | |
|---|---|
| H04B 7/08 | (2006.01) |
| H01Q 1/24 | (2006.01) |
| H01Q 3/24 | (2006.01) |
| H01Q 9/42 | (2006.01) |
| H01Q 21/28 | (2006.01) |
| H01Q 1/48 | (2006.01) |
| H04B 1/44 | (2006.01) |
| H04L 5/14 | (2006.01) |
| H04W 4/06 | (2009.01) |
| H04B 1/04 | (2006.01) |

(52) U.S. Cl.
CPC ............ *H01Q 5/378* (2015.01); *H01Q 9/42* (2013.01); *H01Q 21/28* (2013.01); *H04B 1/44* (2013.01); *H04L 5/14* (2013.01); *H04W 4/06* (2013.01); *H04B 2001/0408* (2013.01)

(56) References Cited

U.S. PATENT DOCUMENTS

| | | | | |
|---|---|---|---|---|
| 6,034,638 | A * | 3/2000 | Thiel | H01Q 1/242 343/702 |
| 6,430,421 | B1 * | 8/2002 | Kiiski | H04B 7/0408 455/277.1 |
| 6,625,202 | B1 * | 9/2003 | Sudo | H04B 1/7115 370/342 |
| 6,751,470 | B1 * | 6/2004 | Ella | H04B 1/005 455/188.1 |
| 6,771,223 | B1 * | 8/2004 | Shoji | H01Q 1/243 343/700 MS |
| 7,197,279 | B2 * | 3/2007 | Bellantoni | G06K 7/0008 375/334 |
| 7,248,843 | B2 * | 7/2007 | Carvalho | H04B 7/0811 455/115.1 |
| 7,594,010 | B2 * | 9/2009 | Dohler | H04B 7/2606 370/328 |
| 7,720,506 | B1 * | 5/2010 | Gribble | H04B 1/0064 455/132 |
| 7,860,182 | B2 * | 12/2010 | Gorsuch | H04B 7/08 375/260 |
| 8,600,462 | B2 * | 12/2013 | Kato | H01Q 21/28 343/751 |
| 9,219,308 | B2 * | 12/2015 | Ali | H01Q 3/247 |
| 9,374,126 | B2 * | 6/2016 | Larsen | H01Q 5/314 |
| 9,705,183 | B2 * | 7/2017 | Nikitin | H01Q 1/245 |
| 2002/0186758 | A1 * | 12/2002 | Vangala | H04B 1/38 375/219 |
| 2003/0060170 | A1 * | 3/2003 | Tikka | H03H 9/70 455/73 |
| 2003/0174763 | A1 * | 9/2003 | Kouki | H04B 1/525 375/219 |
| 2003/0179135 | A1 * | 9/2003 | Louhi | H01Q 1/1257 342/359 |
| 2004/0104791 | A1 * | 6/2004 | Satoh | H03H 3/08 333/193 |
| 2004/0233109 | A1 * | 11/2004 | Ying | H01Q 1/243 343/700 MS |
| 2005/0190304 | A1 * | 9/2005 | Ryu | H04N 5/40 348/724 |
| 2005/0266903 | A1 * | 12/2005 | Masaki | G06F 1/1616 455/575.7 |
| 2008/0123591 | A1 * | 5/2008 | Jung | H04W 48/10 370/330 |
| 2009/0003286 | A1 * | 1/2009 | Korden | H01Q 1/50 370/335 |
| 2009/0102740 | A1 * | 4/2009 | Rofougaran | H01L 23/66 343/860 |
| 2009/0176450 | A1 * | 7/2009 | Chow | H01L 23/48 455/41.1 |
| 2009/0218407 | A1 * | 9/2009 | Rofougaran | G06K 19/0724 235/492 |
| 2010/0013730 | A1 * | 1/2010 | Azhari | H01Q 1/243 343/848 |
| 2010/0053020 | A1 * | 3/2010 | Koyanagi | H01Q 1/243 343/876 |
| 2011/0080325 | A1 * | 4/2011 | Livneh | H01Q 3/26 343/702 |
| 2011/0102287 | A1 * | 5/2011 | Noguchi | H01Q 21/065 343/833 |
| 2011/0116423 | A1 * | 5/2011 | Rousu | H01Q 1/242 370/297 |
| 2011/0149171 | A1 * | 6/2011 | Cowley | H04N 21/4263 348/731 |
| 2011/0243037 | A1 * | 10/2011 | Sundstrom | H04B 7/15542 370/279 |
| 2012/0243448 | A1 * | 9/2012 | Pan | H04W 48/16 370/280 |
| 2013/0122976 | A1 | 5/2013 | Man et al. | |
| 2013/0178179 | A1 * | 7/2013 | Han | H04B 1/0014 455/130 |
| 2013/0257661 | A1 * | 10/2013 | Yuasa | H01Q 1/244 343/702 |
| 2013/0307740 | A1 * | 11/2013 | Pajona | H01Q 7/00 343/748 |
| 2014/0011452 | A1 * | 1/2014 | Ji | H04B 5/00 455/41.1 |
| 2014/0015729 | A1 * | 1/2014 | Uejima | H01Q 9/14 343/850 |
| 2014/0266923 | A1 * | 9/2014 | Zhou | H01Q 5/35 343/702 |
| 2014/0266927 | A1 * | 9/2014 | Qi | H04B 1/005 343/702 |
| 2014/0306857 | A1 * | 10/2014 | Bevelacqua | H01Q 1/243 343/750 |
| 2014/0306859 | A1 * | 10/2014 | Desclos | H01Q 1/50 343/822 |
| 2014/0329475 | A1 * | 11/2014 | Ella | H04B 1/006 455/77 |
| 2015/0201459 | A1 * | 7/2015 | Sato | H01Q 7/00 455/552.1 |
| 2016/0036127 | A1 * | 2/2016 | Desclos | H01Q 5/328 343/745 |
| 2016/0204520 | A1 * | 7/2016 | Dong | H01Q 21/30 343/745 |
| 2016/0309367 | A1 * | 10/2016 | Li | H04L 12/6418 |

FOREIGN PATENT DOCUMENTS

| | | |
|---|---|---|
| EP | 0680161 A1 | 11/1995 |
| EP | 1496564 A1 | 1/2005 |
| EP | 2117079 A1 | 11/2009 |
| KR | 20090117638 A | 11/2009 |
| WO | 2013047358 A1 | 4/2013 |

OTHER PUBLICATIONS

Qualcomm Technologies, Inc.; "WTR1625(L) + WFR1620 RF"; (APAC Carrier Aggregation); Preliminary Reference Schematic: 80-NA805-44 Rev. A; Jan. 23, 2013; 45 pages.

\* cited by examiner

ANTENNA SWITCHING SYSTEM AND METHOD

CROSS-REFERENCE TO RELATED APPLICATIONS

This application is a continuation of International Application No. PCT/CN2014/072142, filed on Feb. 17, 2014, which is hereby incorporated by reference in its entirety.

TECHNICAL FIELD

The present invention relates to the field of mobile terminals, and in particular, to an antenna switching system and method.

BACKGROUND

For a mobile terminal (for example, a mobile phone), when an uplink rate and/or a downlink rate needs to be improved, it may be implemented by increasing a bandwidth. An increase in a bandwidth may be implemented by using carrier aggregation (CA), which specifically includes the following two types: a first type, carrier aggregation within a frequency band; a second type, carrier aggregation in different frequency bands. For the first solution for increasing a bandwidth, a radio-frequency signal may be received by using a primary antenna, and different I/Q (in-phase/quadrature) demodulation is performed on the received radio-frequency signal. For the second solution for increasing a bandwidth, in the prior art, because radio frequency resources actually used in mobile communications are relatively scattered, bandwidths of some frequency bands used in mobile communications are relatively narrow, and the like, when carrier aggregation is performed in different frequency bands, an independent antenna needs to be added for each frequency band, to perform corresponding receiving/sending.

FIG. 1 shows a schematic diagram of an antenna included in a currently common mobile terminal, and to exemplarily show antennas, the antennas are marked by using dashed lines. As shown in the figure, the system includes a primary antenna 1, another primary antenna 2, a diversity antenna 3, and a parasitic antenna 4, where the diversity antenna 3 is used to resist weakness, and the parasitic antenna 4 is used to spread a spectrum. To meet a requirement of carrier aggregation performed in multiple frequency bands, the primary antenna 1 may be used for one frequency band, and the another primary antenna 2 may be used for another frequency band. It can be seen from the figure that the terminal has already included multiple antennas, and moreover, because mobile terminals are increasingly miniaturized, it is extremely difficult to add an antenna within limited space of the mobile terminals.

SUMMARY

An objective of embodiments of the present invention is to provide an antenna switching system and method, so as to resolve a problem in the prior art that a quantity of channels of radio-frequency signals that are to be received or sent is limited by a quantity of primary antennas.

According to a first aspect, an antenna switching system includes a radio-frequency transceiver circuit, a primary antenna, and a parasitic antenna, where the primary antenna is connected to the radio-frequency transceiver circuit. The antenna switching system further includes a switch circuit, configured to connect, when the parasitic antenna is used to receive or send a radio-frequency signal, the parasitic antenna and the radio-frequency transceiver circuit.

With reference to the first aspect, in a first possible implementation manner of the first aspect, a quantity of the parasitic antennas is P, where P is a positive integer, and a quantity of the primary antennas is M, where M is a positive integer; and the switch circuit is specifically configured to connect the parasitic antenna and the radio-frequency transceiver circuit, so as to use, when N channels of radio-frequency signals in different frequency bands that are to be received or sent are needed, K switch circuits to separately establish connections between K parasitic antennas and the radio-frequency transceiver circuit, where M is obtained by subtracting K from N, N is a positive integer greater than 1, and P is greater than or equal to K.

With reference to the first aspect or the first possible implementation manner of the first aspect, in a second possible implementation manner of the first aspect, the switch circuit is further configured to: when only the primary antenna is used to receive or send a radio-frequency signal, cut off a connection between the parasitic antenna and the radio-frequency transceiver circuit, and ground the parasitic antenna.

With reference to the first aspect, or the first possible implementation manner of the first aspect, or the second possible implementation manner of the first aspect, in a third possible implementation manner of the first aspect, the switch circuit is specifically configured to: when a switching instruction sent by a modem of a mobile terminal is received, connect a parasitic antenna specified by the switching instruction to the radio-frequency transceiver circuit.

With reference to the first aspect, or the first possible implementation manner of the first aspect, or the second possible implementation manner of the first aspect, or the third possible implementation manner of the first aspect, in a fourth possible implementation manner of the first aspect, the switch circuit is specifically configured to: when a primary-antenna transceiver instruction sent by a modem of the mobile terminal is received, ground the parasitic antenna.

With reference to the first aspect, or the first possible implementation manner of the first aspect, or the second possible implementation manner of the first aspect, or the third possible implementation manner of the first aspect, or the fourth possible implementation manner of the first aspect, in a fifth possible implementation manner of the first aspect, the switch circuit includes a switch port and further includes an antenna port connected to the parasitic antenna; and the radio-frequency transceiver circuit includes a second duplexer, a second radio frequency power amplifier, and a radio-frequency transceiver, where a receive port of the second duplexer is connected to a second code-division-mode receive port of the radio-frequency transceiver, a second code-division-mode transmit port of the radio-frequency transceiver is connected to a transmit port of the second duplexer after being connected to the second radio frequency power amplifier in series, and an antenna port of the second duplexer is connected to the switch port of the switch circuit; and the switch circuit is further specifically configured to: when a frequency band switch instruction sent by the modem of the mobile terminal is received, enable the antenna port of the switch circuit and a switch port that is connected to the antenna port of the second duplexer and that is specified by the frequency band switch instruction.

With reference to the first aspect, or the first possible implementation manner of the first aspect, or the second possible implementation manner of the first aspect, or the third possible implementation manner of the first aspect, or the fourth possible implementation manner of the first aspect, or the fifth possible implementation manner of the first aspect, in a sixth possible implementation manner of the first aspect, the radio-frequency transceiver circuit further includes a fourth radio frequency power amplifier and a second surface acoustic wave filter; a second time-division-mode transmit port of the radio-frequency transceiver is connected to the switch port of the switch circuit after being connected to the fourth radio frequency power amplifier in series; and a vibration transmit port and a receive port of the second surface acoustic wave filter are respectively connected to the switch port of the switch circuit and a second time-division-mode receive port of the radio-frequency transceiver; and the switch circuit is further specifically configured to: when a selection sending instruction sent by the modem of the mobile terminal is received, enable the antenna port of the switch circuit and a switch port that is connected to the fourth radio frequency power amplifier and that is specified by the selection sending instruction; and when a selection receiving instruction sent by the modem of the mobile terminal is received, enable the antenna port of the switch circuit and a vibration transmit port of the second surface acoustic wave filter specified by the selection receiving instruction.

With reference to the first aspect, or the first possible implementation manner of the first aspect, or the second possible implementation manner of the first aspect, or the third possible implementation manner of the first aspect, or the fourth possible implementation manner of the first aspect, or the fifth possible implementation manner of the first aspect, or the sixth possible implementation manner of the first aspect, in a seventh possible implementation manner of the first aspect, the radio-frequency transceiver circuit further includes a first duplexer, a first radio frequency power amplifier, a third radio frequency power amplifier, a first surface acoustic wave filter, and a single-pole multi-throw switch device, where a receive port of the first duplexer is connected to a first code-division-mode receive port of the radio-frequency transceiver, and a first code-division-mode transmit port of the radio-frequency transceiver is connected to a transmit port of the first duplexer after being connected to the first radio frequency power amplifier in series; an antenna port of the first duplexer is connected to a switch port of the single-pole multi-throw switch device, and an antenna port of the single-pole multi-throw switch device is connected to the primary antenna; a first time-division-mode transmit port of the radio-frequency transceiver is connected to the switch port of the single-pole multi-throw switch device after being connected to the third radio frequency power amplifier in series; a vibration transmit port and a receive port of the first surface acoustic wave filter are respectively connected to the switch port of the single-pole multi-throw switch device and the first time-division-mode receive port of the radio-frequency transceiver; and the single-pole multi-throw switch device is configured to: when a switch instruction sent by a modem of the mobile terminal is received, enable the antenna port of the single-pole multi-throw switch device and a switch port that is connected to the antenna port of the first duplexer and that is specified by the switch instruction, or enable the antenna port of the single-pole multi-throw switch device and a switch port that is connected to the third radio frequency power amplifier and that is specified by the switch instruction, or enable the antenna port of the single-pole multi-throw switch device and a switch port that is connected to the first surface acoustic wave filter and that is specified by the switch instruction.

With reference to the first aspect, or the first possible implementation manner of the first aspect, or the second possible implementation manner of the first aspect, or the third possible implementation manner of the first aspect, or the fourth possible implementation manner of the first aspect, or the fifth possible implementation manner of the first aspect, or the sixth possible implementation manner of the first aspect, or the seventh possible implementation manner of the first aspect, in an eighth possible implementation manner of the first aspect, the switch circuit is specifically further configured to: ground a parasitic antenna, which is not connected to the radio-frequency transceiver circuit, of the P parasitic antennas.

According to a second aspect, an antenna switching method is provided, and the antenna switching method includes if a modem of a mobile terminal receives a multi-channel prompt sent by a base station, generating, by the modem, a switching instruction according to the multichannel prompt, and sending the switching instruction to a switch circuit, and establishing, by the switch circuit, a connection between a parasitic antenna specified by the switching instruction and a radio-frequency transceiver circuit.

With reference to the second aspect, in a first possible implementation manner of the second aspect, the antenna switching method includes: if the modem of the mobile terminal receives a primary-antenna transceiver prompt sent by the base station, generating a primary-antenna transceiver instruction according to the primary-antenna transceiver prompt, and sending the primary-antenna transceiver instruction to the switch circuit; and cutting off, by the switch circuit, the connection between the parasitic antenna and the radio-frequency transceiver circuit, and grounding the parasitic antenna.

With reference to the first aspect or the first possible implementation manner of the first aspect, in a second possible implementation manner of the first aspect, the antenna switching method further includes: establishing, by the modem of the mobile terminal by means of a primary antenna, connections with base stations of different frequency bands at intervals of a preset time segment, receiving broadcast information sent by the base stations, determining whether the multichannel prompt is recorded in the broadcast information, and determining whether the primary-antenna transceiver prompt is recorded in the broadcast information.

Beneficial effects of the embodiments of the present invention are as follows: A parasitic antenna is selectively grounded or connected to a radio-frequency transceiver circuit, so that the parasitic antenna not only may be used to spread a spectrum, but also may be used as an independent receive or transmit antenna when carrier aggregation is needed. By means of the embodiments of the present invention, no new antenna is added, an effect of increasing a quantity of channels of radio-frequency signals that are to be received or sent is achieved by using only a primary antenna and a parasitic antenna included in an existing mobile terminal.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

To make the objectives, technical solutions, and advantages of the present invention clearer and more comprehensible, the following further describes the present invention in detail with reference to the accompanying drawings and embodiments. It should be understood that the specific embodiments described herein are merely used to explain the present invention but are not intended to limit the present invention.

In embodiments of the present invention, each "first" included in "first duplexer", "first radio frequency power amplifier", "first code-division-mode receive port", "first code-division-mode transmit port", "first time-division-mode transmit port", "first time-division-mode receive port", and "first surface acoustic wave filter" is merely used for differentiation; each "second" included in "second duplexer", "second radio frequency power amplifier", "second code-division-mode receive port", "second code-division-mode transmit port", "second time-division-mode transmit port", "second time-division-mode receive port", and "second surface acoustic wave filter" is substitutive reference, and is merely used for differentiation; each "third" included in "third radio frequency power amplifier" and "third surface acoustic wave filter" is merely used for differentiation; and "fourth" included in "fourth radio frequency power amplifier" is also merely used for differentiation.

To describe the technical solutions of the present invention, the following provides descriptions by using specific embodiments.

Figure 1:
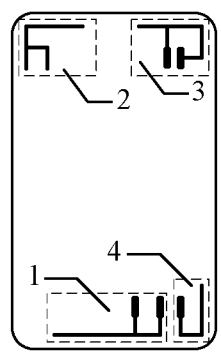
FIG. 1 is a schematic diagram of an antenna in a mobile terminal provided in background of the present invention.
Figure 2:
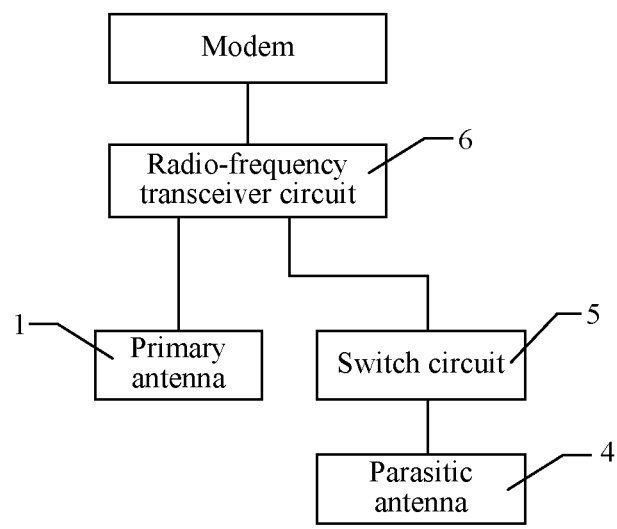
FIG. 2 is a system architecture diagram of an antenna switching system according to an embodiment of the present invention.

FIG. 2 shows a system architecture of an antenna switching system according to an embodiment of the present invention. For ease of description, only a part related to this embodiment of the present invention is shown, and a detailed description is as follows.

An antenna switching system includes a radio-frequency transceiver circuit 6, a primary antenna 1, and a parasitic antenna 4, where the primary antenna 1 is connected to the radio-frequency transceiver circuit 6, and further includes: a switch circuit 5, configured to connect, when the parasitic antenna 4 is used to receive or send a radio-frequency signal, the parasitic antenna 4 and the radio-frequency transceiver circuit 6.

Specifically, the antenna switching system includes one or more primary antennas 1 and one or more parasitic antennas 4, where one primary antenna 1 may be configured to receive or send one channel of radio-frequency signal.

The radio-frequency transceiver circuit 6 includes a radio-frequency transceiver, where the radio-frequency transceiver is connected to a modem of a mobile terminal, and the radio-frequency transceiver is configured to modulate a baseband signal (a low-frequency signal) output by the modem into a high-frequency carrier (where carriers of different frequency bands have different carrier frequencies), and send, by means of the primary antenna 1 and/or the parasitic antenna 4, a radio-frequency signal generated by means of modulation. In addition, when the primary antenna 1 and/or the parasitic antenna 4 receive/receives a radio-frequency signal, the radio-frequency transceiver in the radio-frequency transceiver circuit 6 demodulates the received radio-frequency signal to obtain a baseband signal according to a matched carrier frequency.

Because the primary antenna 1 is connected to the radio-frequency transceiver circuit 6, that is, the primary antenna 1 is in connection to the radio-frequency transceiver circuit 6, and the radio-frequency transceiver circuit 6 may receive and send a radio-frequency signal by means of the primary antenna 1. When the primary antenna 1 is used to receive or send a radio-frequency signal, if it is required to use the parasitic antenna 4 to receive or send a radio-frequency signal, a connection between the parasitic antenna 4 and the radio-frequency transceiver circuit 6 may be established by means of the switch circuit 5, so as to connect the parasitic antenna 4 and the radio-frequency transceiver circuit 6 by means of the switch circuit 5, and therefore, the radio-frequency transceiver circuit 6 may receive or send a radio-frequency signal by means of the parasitic antenna 4.

As a specific embodiment, when two different frequency bands are obtained by means of CA, the primary antenna 1 is used to receive or send a radio-frequency signal of one frequency band; and after the switch circuit 5 is used to connect a parasitic antenna 4 and the radio-frequency transceiver circuit 6, the parasitic antenna 4 is used to receive or send a radio-frequency signal of the other frequency band. By analogy, when multiple different frequency bands are obtained by means of CA, multiple antennas may be selected from all parasitic antennas 4 and/or all primary antennas 1 to receive or send radio-frequency signals in different frequency bands, and further, the modem controls the switch circuit 5 to separately establish connections between the parasitic antennas 4 and the radio-frequency transceiver circuit 6.

Preferably, when a quantity of channels of radio-frequency signals that need to be received exceeds a quantity of the primary antennas 1, all the primary antennas 1 are used to receive or send different channels of radio-frequency signals. At the same time, a connection between the parasitic antenna 4 and the radio-frequency transceiver circuit 6 is established by means of the switch circuit 5, and one channel of radio-frequency signal are received by means of one parasitic antenna 4, so as to implement that remaining channels (where a quantity of the remaining channels is obtained by subtracting a quantity of the primary antennas 1 from a quantity of channels of to-be-received radio-frequency signals) of radio-frequency signals are received or sent by means of one or more parasitic antennas 4.

Specifically, a quantity of the parasitic antennas 4 is P, where P is a positive integer, and a quantity of the primary antennas 1 is M, where M is a positive integer.

A switch circuit 5 is specifically configured to connect the parasitic antenna 4 and the radio-frequency transceiver circuit 6, so as to use K switch circuits 5 to separately establish connections of K parasitic antennas 4 and the radio-frequency transceiver circuit 6 when N channels of radio-frequency signals in different frequency bands that are to be received or sent are needed, where M is obtained by subtracting K from N, N is a positive integer greater than 1, and P is greater than or equal to K.

In this way, each switch circuit 5 establishes a connection between one parasitic antenna 4 and the radio-frequency transceiver circuit 6. If the modem determines that it is required to receive radio-frequency signals of N frequency bands, it is specified that the M primary antennas 1 separately receive different channels of radio-frequency signals, and it is specified that remaining K channels of radio-frequency signals are separately received by K parasitic antennas 4. Further, the modem separately controls K switch circuits 5, so as to separately connect the specified K parasitic antennas 4 and the radio-frequency transceiver circuit 6.

In addition, preferably, the switch circuit 5 is specifically further configured to ground each parasitic antenna 4, which is not connected to the radio-frequency transceiver circuit 6, of the P parasitic antennas 4.

In this way, for the parasitic antenna 4, which is not connected to the radio-frequency transceiver circuit 6 by means of the switch circuit 5, of the P parasitic antennas 4, the modem separately controls a corresponding switch circuit 5 to ground each parasitic antenna 4 that is not connected to the radio-frequency transceiver circuit 6, so as to maintain a spread spectrum function, so that the primary antenna 1 and the parasitic antenna 4 connected to the radio-frequency transceiver circuit 6 can receive a radio-frequency signal of a broader frequency band.

Preferably, the switch circuit 5 is further configured to: when only the primary antenna 1 is used to receive a radio-frequency signal, cut off a connection between the parasitic antenna 4 and the radio-frequency transceiver circuit 6, and ground the parasitic antenna 4.

Specifically, when the parasitic antenna 4 is not needed to receive a radio-frequency signal, and only the primary antenna 1 is needed to receive a radio-frequency signal, all parasitic antennas 4 are grounded. Further, the parasitic antenna 4 is still configured to spread a spectrum, so that the primary antenna 1 can receive a radio-frequency signal of a broader frequency band.

Preferably, the switch circuit 5 is specifically configured to: when a switching instruction sent by a modem of a mobile terminal is received, connect the parasitic antenna 4 specified by the switching instruction to the radio-frequency transceiver circuit 6.

Specifically, at intervals of a preset time segment, the primary antenna 1 receives a radio-frequency signal that is sent by a base station and that carries broadcast information. After a baseband signal carrying the broadcast information is obtained by processing, by a radio-frequency receiver circuit, the radio-frequency signal carrying the broadcast information, the modem extracts the broadcast information from the baseband signal. If a multichannel prompt is recorded in the broadcast information, it represents that it is required to receive at least two channels of radio-frequency signals obtained by means of CA, and different frequency bands obtained by means of CA are extracted from the multichannel prompt, so as to further determine a quantity of channels of radio-frequency signals that a mobile terminal needs to receive or send. Specifically, because each switch circuit 5 can be connected to only one parasitic antenna, the modem further generates a switching instruction according to the multichannel prompt, where the switching instruction specifies parasitic antennas 4 to be used. Further, the switch circuits 5 receiving the switching instruction establishes connections of corresponding parasitic antennas 4 and the radio-frequency transceiver circuit 6. Further, a corresponding quantity of channels (where a value of the corresponding quantity of channels is the same as a value of a quantity of the parasitic antennas 4 specified by the switching instruction) of radio-frequency signals are received by means of the parasitic antennas 4 specified by the switching instruction.

Preferably, the switch circuit 5 is specifically configured to: when a primary-antenna transceiver instruction sent by a modem of the mobile terminal is received, ground the parasitic antenna 4.

Specifically, when the switch circuit 5 receives the primary-antenna transceiver instruction sent by the modem, it represents that it is required to use only the primary antenna 1 to receive a radio-frequency signal. To improve a bandwidth of a radio-frequency signal that can be received by the primary antenna 1, all parasitic antennas 4 are grounded.

Figure 3:
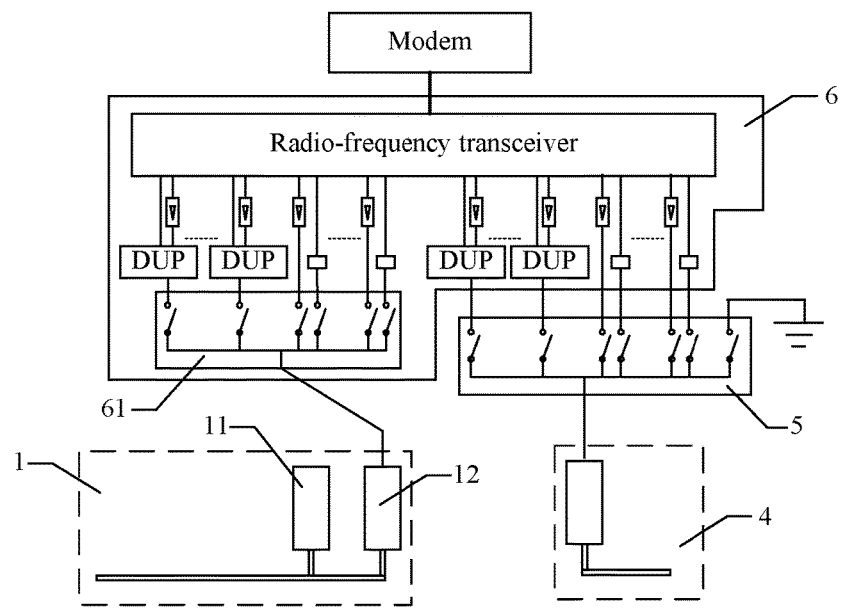
FIG. 3 is a diagram of a specific circuit of an antenna switching system according to an embodiment of the present invention.

In another embodiment of the present invention, FIG. 3 is used to show a specific circuit of an antenna switching system according to an embodiment of the present invention. In FIG. 3, to avoid mistaking a mark line for a part of an antenna, a primary antenna 1 is marked by using a dashed-line block, and a parasitic antenna 4 is also marked by using a dashed-line block. Moreover, to exemplarily show connection relationships between an internal circuit of a radio-frequency transceiver circuit 6, and the primary antenna 1 and a switch circuit 5, the radio-frequency transceiver circuit 6 is also marked by using a dashed-line block. A single-pole multi-throw switch device 61 is represented by using a solid-line block and multiple switches included in the solid-line block, and an antenna port of the single-pole multi-throw switch device 61 (a fixing port of a switch device) is connected to the primary antenna 1. A DUP connected to a switch port (a throw port of a switch device) of the single-pole multi-throw switch device 61 is a first duplexer, a square block connected to a transmit port of the first duplexer and internally including a triangle is a first radio frequency power amplifier, a square block connected to a switch port of the single-pole multi-throw switch device 61 and internally including a triangle is a third radio frequency power amplifier, and a rectangular box connected to the switch port of the single-pole multi-throw switch device 61 is a first surface acoustic wave filter (SAW). In addition, the switch circuit 5 is represented by using a solid-line block including one or more switches. Moreover, a DUP connected to a switch port of the switch circuit 5 is a second duplexer. A square block connected to a transmit port of a second duplexer and including a triangle is a second radio frequency power amplifier, a square block connected to a switch port of the switch circuit 5 and including a triangle is a fourth radio frequency power amplifier, and a rectangular box connected to a switch port of the switch circuit 5 is a second surface acoustic wave filter.

It needs to be emphasized that the antenna switching system according to this embodiment of the present invention includes one or more primary antennas 1, and further includes one or more parasitic antennas 4. For exemplary purpose, FIG. 3 provides a diagram of a specific circuit connection between only one primary antenna 1 and a radio-frequency transceiver circuit 6, and provides a diagram of specific circuit connections between only one switch circuit 5, and only one parasitic antenna 4 and a radio-frequency transceiver circuit 6. In addition, it should be noted that for each parasitic antenna 4, one switch circuit 5 needs to be used to establish a connection to the radio-frequency transceiver circuit 6. For exemplary purpose, the following describes a specific circuit in which only one parasitic antenna 4 is connected to the radio-frequency transceiver circuit 6 by means of only one switch circuit 5.

In addition, it needs to be noted that in this embodiment of the present invention, a connection between a feed port 12 of the primary antenna 1 and an antenna port of a single-pole multi-throw switch device 61 is always maintained; and in addition, whether a ground port 11 of the primary antenna 1 is grounded is determined according to a working scenario of the primary antenna 1.

In another embodiment of the present invention, the parasitic antenna 4 is configured to perform code-division multiplex communication (for example, multichannel radio frequency communication by using a Wideband Code Division Multiple Access (WCDMA) communications protocol), and the switch circuit 5 includes one or more switch ports and further includes one antenna port connected to the parasitic antenna 4; and the radio-frequency transceiver circuit 6 includes one or more second duplexers, one or more second radio frequency power amplifiers, and a radio-frequency transceiver, where the radio-frequency transceiver has one or more second code-division-mode receive ports, and further has one or more second code-division-mode transmit ports, a receive port of the second duplexer is connected to a second code-division-mode receive port of the radio-frequency transceiver, a second code-division-mode transmit port of the radio-frequency transceiver is connected to a transmit port of the second duplexer after being connected to a second radio frequency power amplifier in series, and an antenna port of the second duplexer is connected to a switch port of the switch circuit 5. In addition, the radio-frequency transceiver further has one or more interaction ends capable of communicating with a modem.

Moreover, the switch circuit 5 is further specifically configured to: when a frequency band switch instruction sent by a modem of a mobile terminal is received, enable an antenna port of the switch circuit 5 and a switch port that is connected to an antenna port of a second duplexer and that is specified by the frequency band switch instruction.

The switch circuit 5 includes one or more switches, a port of each switch is connected together to form an antenna port of the switch circuit 5, and another port of the switch is a switch port of the switch circuit 5, that is, another port of each switch is separately a switch port of the switch circuit 5. By analogy, an antenna port of one switch circuit 5 can be connected to one parasitic antenna 4. Therefore, each parasitic antenna 4 that needs to be added with a radio-frequency signal sending or receiving function needs one switch circuit 5 to provide a corresponding antenna port, so as to be connected to the parasitic antenna 4.

Preferably, the switch circuit 5 is a single-pole multi-throw switch device, and a common port of the single-pole multi-throw switch device is an antenna port of the switch circuit 5, and another port (except the common port of the single-pole multi-throw switch device) of each single-pole multi-throw switch device is separately a switch port of the switch circuit 5.

Specifically, first, a mobile terminal receives, by means of a primary antenna 1, broadcast information sent by a base station. Further, according to a multichannel prompt recorded in the broadcast information, a modem knows frequency bands in which multiple channels of radio-frequency signals that need to be received are separately located, and generates a switching instruction (where the switching instruction specifies a parasitic antenna 4 that is configured to receive or send a radio-frequency signal of a frequency band). For a parasitic antenna 4 specified by the switching instruction, if the multichannel prompt further specifies that a communications standard is code-division communication, a frequency band switch instruction is generated, the frequency band switch instruction is sent to a switch circuit 5 connected to the parasitic antenna 4, and the frequency band switch instruction controls the switch circuit 5 to connect the parasitic antenna 4 and a second duplexer. Specifically, because switch ports of different switches included in the switch circuit 5 are connected to second duplexers of different frequency bands, the frequency band switch instruction is used to specify that the parasitic antenna 4 is connected to a corresponding second duplexer in the radio-frequency transceiver circuit 6 by means of a switch that corresponds to a frequency band and that is included in the switch circuit 5. A second duplexer is specified by specifying a switch, so as to further specify a radio-frequency signal of a frequency band that is to be received in code-division communication.

Further, when a parasitic antenna 4 is used to receive a radio-frequency signal of code-division communication, the parasitic antenna 4 transmits the received radio-frequency signal to an antenna port of a second duplexer; the second duplexer transmits the received radio-frequency signal from a receive port to a second code-division-mode receive port of a radio-frequency transceiver; and further, the radio-frequency transceiver performs code-division demodulation on the received radio-frequency signal, to obtain a baseband signal by means of demodulation, and sends the baseband signal obtained by means of demodulation from one or more interaction ends to a modem.

Correspondingly, after a baseband signal sent by a modem is received, a radio-frequency transceiver performs code-division modulation on the received baseband signal, and at the same time, the modem already sends a frequency band switch instruction to the switch circuit 5, to turn on a specified switch and establish a connection between a parasitic antenna 4 (which is a parasitic antenna 4 connected to the switch circuit 5) and a corresponding second duplexer (similarly, a second duplexer is specified by specifying a switch, so as to specify a radio-frequency signal of a frequency band that is to be sent). Further, the radio-frequency transceiver performs code-division modulation on the baseband signal according to a frequency band specified by the modem, a second power amplifier is used to perform power amplification on a radio-frequency signal generated by means of the code-division modulation, and after passing through a specified duplexer and a specified switch, a radio-frequency signal after power amplification is transmitted to a corresponding parasitic antenna 4, so as to send the radio-frequency signal.

In another embodiment of the present invention, the parasitic antenna 4 may be further configured to perform time-division multiplex communication (for example, multichannel radio frequency communication by using a TD-LTE communications protocol), and the radio-frequency transceiver circuit 6 further includes one or more fourth radio frequency power amplifiers and one or more second surface acoustic wave filters; a second time-division-mode transmit port of the radio-frequency transceiver is connected to the switch port of the switch circuit 5 after being connected to the fourth radio frequency power amplifier in series; and a vibration transmit port of the second surface acoustic wave filter is connected to a switch port of the switch circuit 5, and a receive port of the second surface acoustic wave filter is connected to a second time-division-mode receive port of the radio-frequency transceiver.

Moreover, the switch circuit 5 is further specifically configured to: when a selection sending instruction sent by a modem of a mobile terminal is received, enable an antenna port of the switch circuit 5 and a switch port that is connected to the fourth radio frequency power amplifier and that is specified by the selection sending instruction; and when a selection receiving instruction sent by a modem of a mobile terminal is received, enable an antenna port of the switch circuit 5 and a vibration transmit port of the second surface acoustic wave filter specified by the selection receiving instruction.

Specifically, first, a mobile terminal receives, by means of a primary antenna 1, broadcast information sent by a base station. Further, a modem generates a switching instruction according to a multichannel prompt recorded in the broadcast information, where the switching instruction specifies one or more parasitic antennas 4.

At the same time, for a parasitic antenna 4 specified by the switching instruction, the modem knows, according to the multichannel prompt recorded in the broadcast information, frequency bands in which multiple channels of radio-frequency signals that need to be sent are separately located. If the multichannel prompt further specifies that a communications standard is time-division communication, a selection sending instruction is generated, and the selection sending instruction controls the switch circuit 5 to connect the parasitic antenna 4 and a fourth radio frequency power amplifier. Specifically, because switch ports of different switches included in the switch circuit 5 are connected to fourth radio frequency power amplifiers of different frequency bands, the selection sending instruction specifies a switch that is included in the switch circuit 5 and by means of which the parasitic antenna 4 is connected to a corresponding fourth radio frequency power amplifier in the radio-frequency transceiver circuit 6. A fourth radio frequency power amplifier is specified by specifying a switch, so as to further specify a radio-frequency signal of a frequency band that is to be sent in time-division communication.

Similarly, for a parasitic antenna 4 specified by the switching instruction, the modem knows, from the multichannel prompt recorded in the broadcast information, frequency bands in which multiple channels of radio-frequency signals that need to be received are separately located. If the multichannel prompt further specifies that a communications standard is time-division communication, a selection receiving instruction is generated, and the selection receiving instruction controls the switch circuit 5 to connect the parasitic antenna 4 and a second surface acoustic wave filter. Specifically, because switch ports of different switches included in the switch circuit 5 are connected to second surface acoustic wave filters of different frequency bands, the selection receiving instruction specifies a switch that is included in the switch circuit 5 and by using which the parasitic antenna 4 is connected to a corresponding second surface acoustic wave filter in the radio-frequency transceiver circuit 6. A second surface acoustic wave filter is specified by specifying a switch, so as to further specify a radio-frequency signal of a frequency band that is to be received in code-division communication.

In other words, on one hand, after a baseband signal sent by a modem is received, a radio-frequency transceiver performs time-division modulation on the received baseband signal. At the same time, the modem sends a selection receiving instruction to a switch circuit 5, to establish a connection between a parasitic antenna 4 and a corresponding second radio frequency power amplifier by means of a switch specified by the selection receiving instruction. On the other hand, a radio-frequency transceiver performs time-division modulation on a baseband signal by means of a frequency band specified by a modem, and a radio-frequency signal generated by means of the time-division modulation is transmitted to a parasitic antenna 4 by means of a specified second radio frequency power amplifier and a specified switch, so as to transmit the radio-frequency signal.

Correspondingly, when a parasitic antenna 4 is used to receive a radio-frequency signal of time-division communication, the parasitic antenna 4 transmits the received radio-frequency signal to a vibration transmit port of a second surface acoustic wave filter; the second surface acoustic wave filter filters the received radio-frequency signal and transmits a radio-frequency signal after filtration to a second time-division-mode receive port of a radio-frequency transceiver; and further, the radio-frequency transceiver performs time-division demodulation on the received radio-frequency signal, to obtain a baseband signal by means of demodulation, and sends the baseband signal obtained by means of demodulation to a modem.

Preferably, one or more second time-division-mode transmit ports of the radio-frequency transceiver may be connected to a switch port of the switch circuit 5 after being connected to the fourth radio frequency power amplifier and a third surface acoustic wave filter in series. The third surface acoustic wave filter performs noise removing filtration on a radio-frequency signal sent from a second time-division-mode transmit port of the radio-frequency transceiver.

In another embodiment of the present invention, for a case in which a radio-frequency signal is sent or received by using a primary antenna 1, the radio-frequency transceiver circuit 6 includes one or more single-pole multi-throw switch devices 61, where an antenna port of each single-pole multi-throw switch device 61 is externally connected to one primary antenna 1. For ease of explanation, the following describes in details only a case in which one primary antenna 1 is externally connected.

Specifically, the radio-frequency transceiver circuit 6 further includes one or more first duplexers, one or more first radio frequency power amplifiers, one or more third radio frequency power amplifiers, one or more first surface acoustic wave filters, and a single-pole multi-throw switch device 61, where a receive port of the first duplexer is connected to a first code-division-mode receive port of the radio-frequency transceiver, and a first code-division-mode transmit port of the radio-frequency transceiver is connected to a transmit port of the first duplexer after being connected to the first radio frequency power amplifier in series; an antenna port of the first duplexer is connected to a switch port of the single-pole multi-throw switch device 61, and an antenna port of the single-pole multi-throw switch device 61 is connected to the primary antenna 1; a first time-division-mode transmit port of the radio-frequency transceiver is connected to the switch port of the single-pole multi-throw switch device 61 after being connected to the third radio frequency power amplifier in series; a vibration transmit port and a receive port of the first surface acoustic wave filter are respectively connected to the switch port of the single-pole multi-throw switch device 61 and a first time-division-mode receive port of the radio-frequency transceiver; and moreover, the single-pole multi-throw switch device 61 is configured to: when a switch instruction sent by a modem of the mobile terminal is received, enable the antenna port of the single-pole multi-throw switch device 61 and the switch port connected to the antenna port of the first duplexer specified by the switch instruction, or enable the antenna port of the single-pole multi-throw switch device 61 and the switch port connected to the third radio frequency power amplifier specified by the switch instruction, or enable the antenna port of the single-pole multi-throw switch device 61 and the switch port connected to the first surface acoustic wave filter specified by the switch instruction.

More specifically, when connected to the primary antenna 1 and the radio-frequency transceiver circuit 6, the first duplexer is configured to transmit a radio-frequency signal of code-division communication. For different first duplexers manufactured, received or sent radio-frequency signals are located in different frequency bands. Specifically, when it is required to use the primary antenna 1 to send a radio-frequency signal of the code-division communication, a radio-frequency transceiver sends a modulated radio-frequency signal from a first code-division-mode transmit port to a first radio frequency amplifier to perform power amplification, and the first duplexer receives a radio-frequency signal after power amplification from a transmit port and sends the radio-frequency signal after power amplification from an antenna port to the primary antenna 1, so as to transmit the radio-frequency signal. When it is required to use the primary antenna 1 to receive a radio-frequency signal of the code-division communication, the first duplexer acquires, by means of the antenna port, a radio-frequency signal received by the primary antenna 1 and transmits, by means of the receive port, the acquired radio-frequency signal to a first code-division-mode receive port of the radio-frequency transceiver.

The first surface acoustic wave filter is configured to perform time-division communication, and when connected to the primary antenna 1 and the radio-frequency transceiver, the first surface acoustic wave filter transmits a radio-frequency signal, which is received by the primary antenna 1, of time-division communication to the radio-frequency transceiver. Specifically, the first surface acoustic wave filter filters a radio-frequency signal, which is received by the primary antenna 1, of time-division communication, and transmits a radio-frequency signal after filtration to a first time-division-mode receive port connected to the first surface acoustic wave filter.

The third radio frequency power amplifier is configured to perform time-division communication, and when connected to the primary antenna 1 and the radio-frequency transceiver, the third radio frequency power amplifier is configured to perform power amplification on a radio-frequency signal, which is sent from a first time-division-mode transmit port of a radio-frequency transceiver, of time-division communication, and send the radio-frequency signal after power amplification to the primary antenna 1, so as to transmit the radio-frequency signal.

Further, when the modem receives a multichannel prompt or a primary-antenna-1 transceiver prompt that is sent by a base station, a switch instruction is generated; if a switch port connected to an antenna port of a first duplexer is specified by the switch instruction, an antenna port of the single-pole multi-throw switch device 61 and a switch port that is specified by the switch instruction and that is connected to an antenna port of the first duplexer are enabled, so as to receive or send a radio-frequency signal of code-division communication by means of the primary antenna 1.

If a switch port connected to a third radio frequency power amplifier is specified by the switch instruction, an antenna port of the single-pole multi-throw switch device 61 and a switch port that is specified by the switch instruction and that is connected to the third radio frequency power amplifier are enabled, so as to send a radio-frequency signal of time-division communication by means of the primary antenna 1.

If a switch port connected to a first surface acoustic wave filter is specified by the switch instruction, an antenna port of the single-pole multi-throw switch device 61 and a switch port that is specified by the switch instruction and that is connected to the first surface acoustic wave filter are enabled, so as to receive a radio-frequency signal of time-division communication by means of the primary antenna 1.

Preferably, one or more first time-division-mode transmit ports of the radio-frequency transceiver may be connected to a switch port of the single-pole multi-throw switch device 61 after being connected to the third radio frequency power amplifier and a surface acoustic wave filter in series. The surface acoustic wave filter performs noise removing filtration on a radio-frequency signal sent by a first time-division-mode transmit port of the radio-frequency transceiver.

Figure 4:
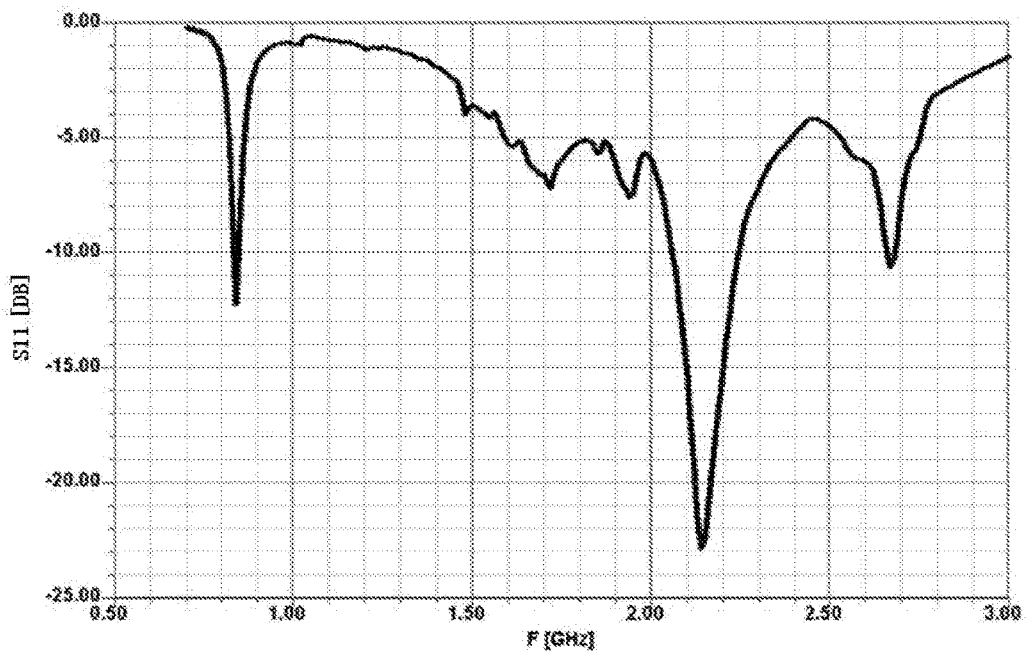
FIG. 4 is a diagram of antenna performance of a primary antenna in a switching system including a primary antenna and a grounded parasitic antenna according to an embodiment of the present invention.
Figure 5:
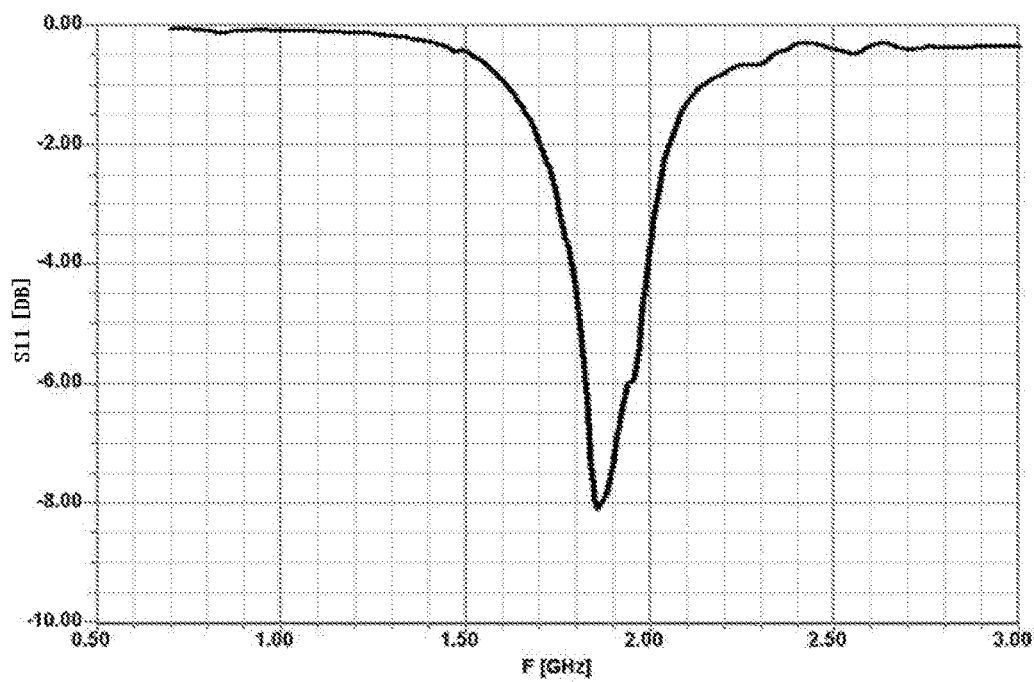
FIG. 5 is a diagram of antenna performance of a parasitic antenna in an antenna switching system including a primary antenna and a parasitic antenna that is connected to a radio-frequency transceiver circuit according to an embodiment of the present invention.
Figure 6:
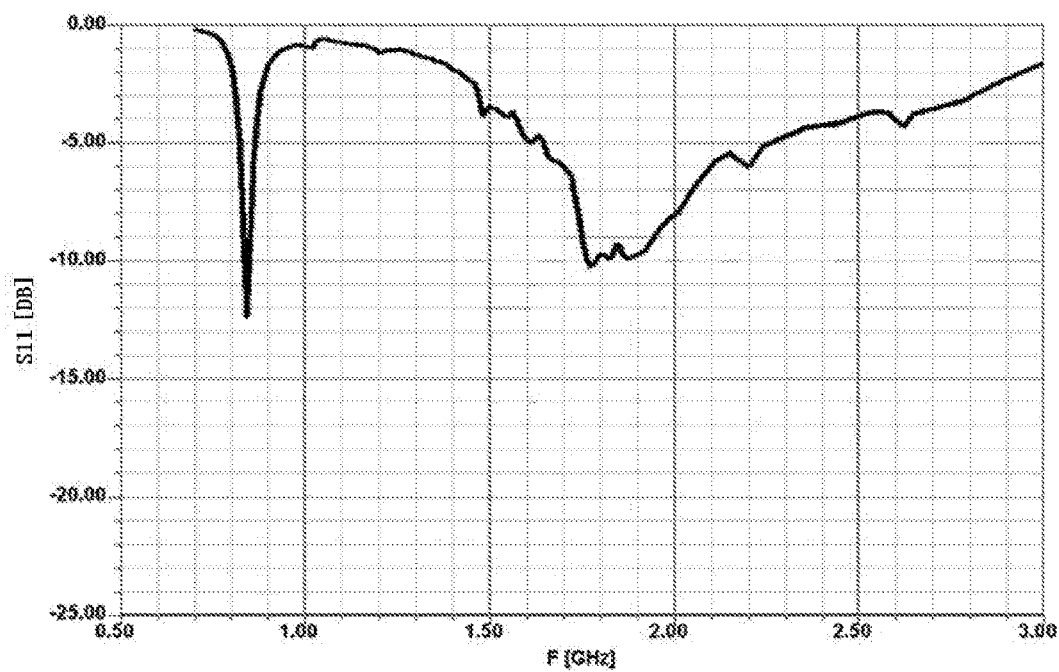
FIG. 6 is a diagram of antenna performance of a primary antenna in an antenna switching system including a primary antenna and a parasitic antenna that is connected to a radio-frequency transceiver circuit according to an embodiment of the present invention.

To better describe beneficial effects of the embodiments of the present invention, a switching system including one primary antenna 1 and one grounded parasitic antenna 4 is used as an example. FIG. 4 shows a diagram of antenna performance of the primary antenna 1 when the parasitic antenna 4 in the switching system is grounded; FIG. 5 shows a diagram of antenna performance of the parasitic antenna 4 when the parasitic antenna 4 in the antenna switching system is connected to a radio-frequency transceiver circuit by means of a switch circuit 5; FIG. 6 shows a diagram of antenna performance of the primary antenna 1 when the parasitic antenna 4 in the antenna switching system is connected to a radio-frequency transceiver circuit by means of a switch circuit 5.

In FIG. 4, FIG. 5, and FIG. 6, a horizontal coordinate represents a frequency, and a unit is GHz (GHz); a vertical coordinate represents a return loss, and a unit is decibel (DB).

When the parasitic antenna 4 in the antenna switching system is grounded, and only the primary antenna 1 is used to receive and send a radio-frequency signal, it can be seen from FIG. 4 that the primary antenna has a relatively small return loss and can desirably receive or send a channel of radio-frequency signal.

After the parasitic antenna 4 in the antenna switching system is connected to a radio-frequency transceiver circuit by means of a switch circuit 5, it can be seen from FIG. 5 and FIG. 6 that the primary antenna 1 and the parasitic antenna 4 both have a relatively small return loss in a frequency band of 0.5 GHz to 3 GHz and have relatively good antenna performance, so that the primary antenna 1 can desirably receive or send a channel of radio-frequency signal, and the parasitic antenna 4 can also desirably receive or send a channel of radio-frequency signal.

In addition, as shown in FIG. 5, for the parasitic antenna 4 connected to the radio-frequency transceiver circuit by means of the switch circuit 5, in a frequency band of 0.5 GHz to 1.7 GHz and in a frequency band of 2.0 GHz to 3 GHz, the parasitic antenna 4 has a very small return loss and relatively good antenna performance.

In this way, it can be seen from FIG. 4, FIG. 5, and FIG. 6 that regardless of whether a switch circuit selectively connects the parasitic antenna 4 and the ground or connects the parasitic antenna 4 and the radio-frequency transceiver circuit, the primary antenna 1 can desirably receive or send a channel of radio-frequency signal. When carrier aggregation is needed, the parasitic antenna 4 may be further used as an independent receive or transmit antenna.

As an embodiment of the present invention, if a mobile terminal is further provided with a diversity antenna, when it is required to use the diversity antenna to receive or send a radio-frequency signal, the diversity antenna is connected to the radio-frequency transceiver circuit 6, and further, it is implemented that each diversity antenna is used to separately receive a channel of radio-frequency signal. By analogy, when it is required to use diversity antennas to receive multiple channels of radio-frequency signals, a corresponding quantity (a value of the corresponding quantity is the same as a value of a quantity of channels of radio-frequency signals) of diversity antennas are connected to the radio-frequency transceiver circuit 6, so as to receive multiple channels of radio-frequency signals. If it is not required to use a diversity antenna to receive a radio-frequency signal, the diversity antenna is grounded, so as to maintain a weakness-resistance function of the diversity antenna.

It should be noted that the antenna switching method provided in the embodiments of the present invention and the antenna switching system provided in the embodiments of the present invention are applicable to each other.

Figure 7:
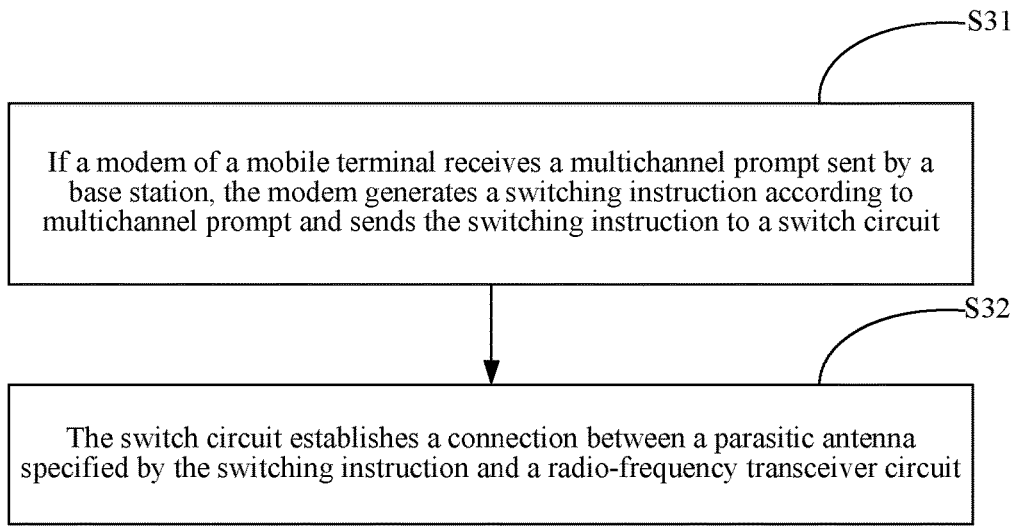
FIG. 7 is a flowchart of a first antenna switching method according to an embodiment of the present invention.

FIG. 7 shows a procedure of a first antenna switching method according to an embodiment of the present invention. For ease of description, only a part related to this embodiment of the present invention is shown, and a detailed description is as follows.

An antenna switching method is provided, and the antenna switching method includes.

S31: If a modem of a mobile terminal receives a multichannel prompt sent by a base station, the modem generates a switching instruction according to multichannel prompt and sends the switching instruction to a switch circuit.

S32: The switch circuit establishes a connection between a parasitic antenna specified by the switching instruction and a radio-frequency transceiver circuit.

It should be noted that the mobile terminal is already provided with one or more parasitic antennas, one or more primary antennas, a radio-frequency transceiver circuit, and the like. Preferably, one parasitic antenna is connected to one switch circuit.

Specifically, a base station regularly sends a broadcast message to the mobile terminal, where a multichannel prompt or a primary-antenna transceiver prompt may be recorded in the broadcast message. If the mobile terminal acquires a multichannel prompt from the received broadcast message, the multichannel prompt notifies the mobile terminal to receive or send multiple channels of radio-frequency signals. If a mobile terminal needs to use a parasitic antenna to receive a radio-frequency signal, a switching instruction is generated, and a parasitic antenna configured to receive a radio-frequency signal is specified by the switching instruction, where there may be one or more parasitic antennas specified by the switching instruction. It should be noted that one specified parasitic antenna is configured to receive one channel of radio-frequency signal.

Because one switch circuit can be connected only to one parasitic antenna externally, after each switch circuit corresponding to a parasitic antenna specified by the switching instruction receives the switching instruction, a connection between the parasitic antenna specified by the switching instruction and the radio-frequency transceiver circuit is established. After the parasitic antenna is connected to the radio-frequency transceiver circuit by means of a switch circuit, a radio-frequency signal is received or sent by means of the parasitic antenna.

Figure 8:
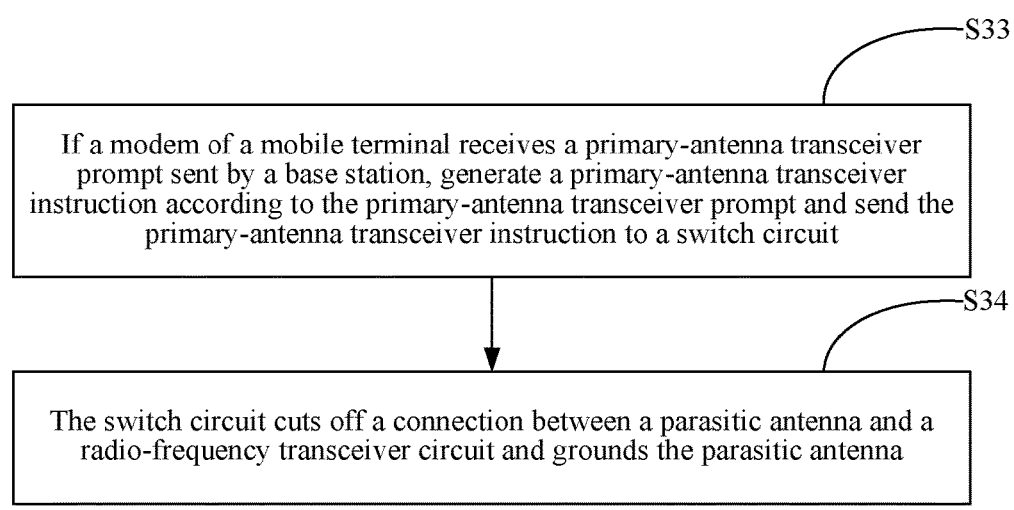
FIG. 8 is a flowchart of a second antenna switching method according to an embodiment of the present invention.
Figure 9:
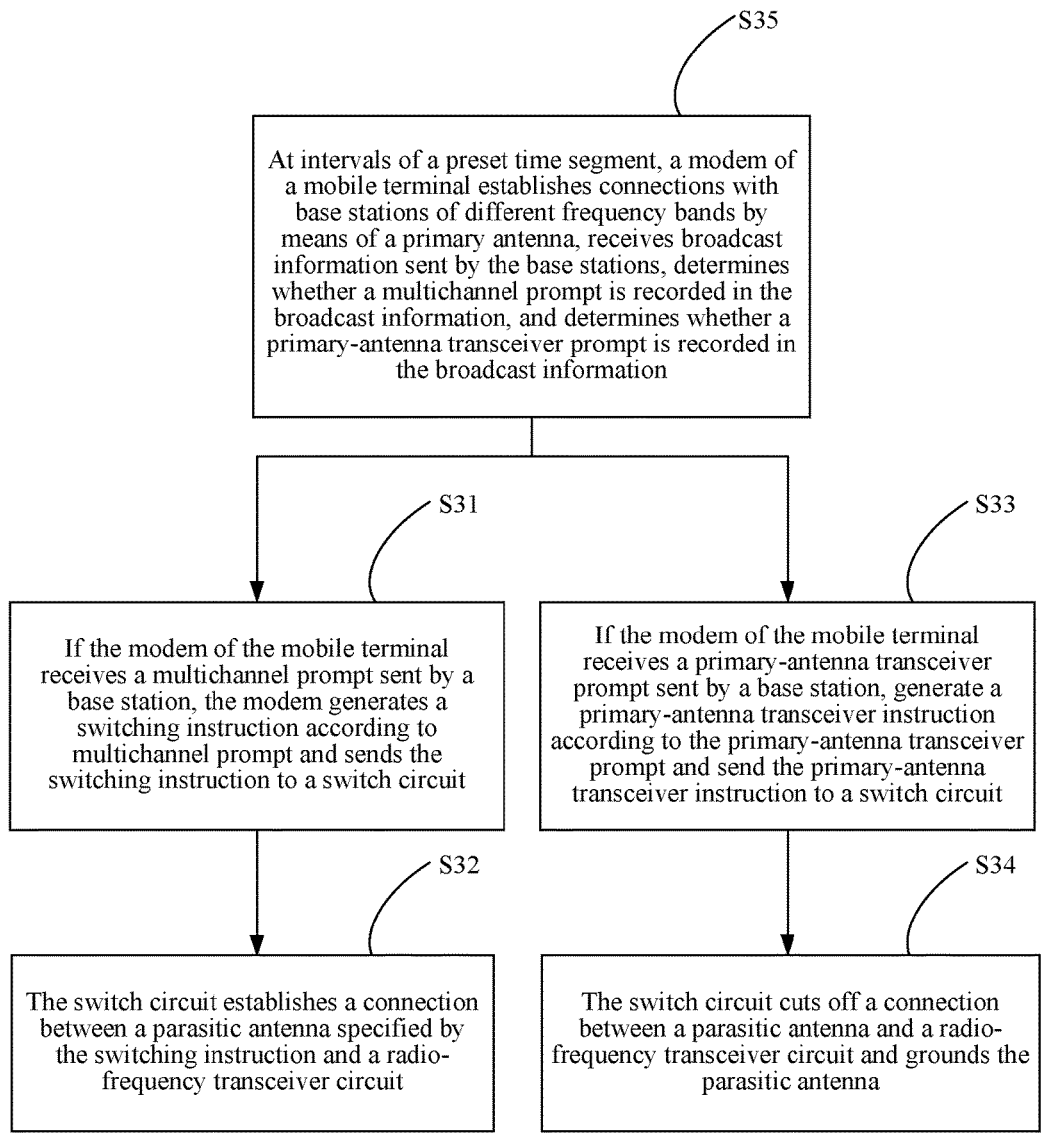
FIG. 9 is a flowchart of a third antenna switching method according to an embodiment of the present invention.

FIG. 8 shows a procedure of a second antenna switching method according to an embodiment of the present invention. For ease of description, only a part related to this embodiment of the present invention is shown, and a detailed description is provided below. It should be noted that the second antenna switching method is optimized based on the first antenna switching method. Therefore, the procedure included in the first antenna switching method is not described in detail herein again.

Preferably, the antenna switching method includes.

S33: If the modem of the mobile terminal receives a primary-antenna transceiver prompt sent by a base station, generate a primary-antenna transceiver instruction according to the primary-antenna transceiver prompt and send the primary-antenna transceiver instruction to a switch circuit.

S34: The switch circuit cuts off a connection between the parasitic antenna and the radio-frequency transceiver circuit and grounds the parasitic antenna.

Specifically, if the modem of the mobile terminal extracts only the primary-antenna transceiver prompt from the received broadcast message, the modem generates a primary-antenna transceiver instruction. Further, the radio-frequency transceiver circuit sends or receives one or more channels of radio-frequency signals according to one or more primary antennas specified by the primary-antenna transceiver instruction. It should be noted that one primary antenna is configured to send or receive one channel of radio-frequency signal.

At the same time, when receiving a primary-antenna transceiver instruction, the switch circuit directly cuts off a connection between the parasitic antenna and the radio-frequency transceiver circuit and grounds the parasitic antenna, so as to maintain a spread spectrum function of the parasitic antenna.

FIG. 8 shows a process of a third antenna switching method according to an embodiment of the present invention. For ease of description, only a part related to this embodiment of the present invention is shown, and a detailed description is provided below. It should be noted that the second antenna switching method is further optimized based on the second antenna switching method. Therefore, procedures included in the first antenna switching method and the second antenna switching method are not described in detail herein.

Preferably, before step S31 or step S33 is performed, the antenna switching method further includes.

S35: At intervals of a preset time segment, the modem of the mobile terminal establishes connections with base stations of different frequency bands by means of the primary antenna, receives broadcast information sent by the base stations, determines whether a multichannel prompt is recorded in the broadcast information, and determines whether a primary-antenna transceiver prompt is recorded in the broadcast information.

Specifically, to save power, generally, a mobile terminal is in a sleep state, that is, all parasitic antennas are grounded; a modem controls a single-pole multi-throw switch device in a radio-frequency transceiver circuit to cut off a connection of a primary antenna and a radio-frequency transceiver that is in the radio-frequency transceiver circuit, so that the radio-frequency transceiver cannot receive or send a radio-frequency signal by means of the primary antenna.

Then, at intervals of a preset time segment, the modem of the mobile terminal controls each switch in the single-pole multi-throw switch device to be separately turned off once, so as to scan each frequency band. It should be noted that different frequency bands are selected by means of different switches in a single-pole multi-throw switch device. Further, when switches in the single-pole multi-throw switch device are turned on, a modem of a mobile terminal receives a broadcast signal sent by a base station. If the broadcast signal carries a multichannel prompt, one or more channels of radio-frequency signals are received by means of one or more primary antennas in mobile communication, and at the same time, the modem of the mobile terminal determines whether it is required to use a parasitic antenna to receive another channel of radio-frequency signal. If it is required, a switching instruction is generated, so as to specify, by means of the switching instruction, a parasitic antenna configured to receive a radio-frequency signal, to establish a connection between the parasitic antenna and the radio-frequency transceiver circuit. Alternatively, if the broadcast signal carries a primary-antenna transceiver prompt, a primary-antenna transceiver instruction is generated, and the primary antenna is controlled by the primary-antenna transceiver instruction to receive a radio-frequency signal.

Further, when the broadcast signal carries the multichannel prompt, the mobile terminal initiates a request for establishing a radio frequency connection to the base station by means of a primary antenna and/or a parasitic antenna. After the radio frequency connection is completed, functions such as answering a call and receiving a short message service message are implemented.

The foregoing content further describes the present invention in detail with reference to specific exemplary embodiments, and the specification should not be construed as a limitation on the specific embodiments of the present invention. A person of ordinary skill in the art, to which the present invention belong, may make some equivalent replacements or obvious variations without departing from the principle of the present invention, performance or functions of the replacements or variations are the same as that in the present invention, and the replacements or variations should fall within the protection scope determined by the claims of the present invention.

What is claimed is:

1. An antenna switching system, comprising:
    a radio-frequency transceiver circuit;
    a primary antenna connected to the radio-frequency transceiver circuit;
    a switch circuit; and
    a parasitic antenna connected to the radio-frequency transceiver circuit through the switch circuit;
    wherein, the switch circuit is configured to:
        connect, in response to receiving a switching instruction from a modem of a mobile terminal, the parasitic antenna specified by the switching instruction, for the parasitic antenna to communicate a second radio-frequency signal on a second channel at a same time that the primary antenna is communicating a first radio-frequency signal on a first channel, wherein a frequency band of the second radio-frequency signal is different from the frequency band of the first radio-frequency signal, and wherein the switching instruction indicates a requirement that the second channel be aggregated with the first channel; and
        cut off, in response to receiving a primary antenna transceiver instruction from the modem indicating that the parasitic antenna is not being used to communicate the second radio-frequency signal, a connection between the parasitic antenna and the radio-frequency transceiver circuit, and ground the parasitic antenna.

2. The antenna switching system according to claim 1, wherein the switch circuit comprises a switch port and an antenna port configured to connect to the parasitic antenna;
    wherein the radio-frequency transceiver circuit comprises a second duplexer, a second radio frequency power amplifier, and a radio-frequency transceiver, wherein a receive port of the second duplexer is connected to a second code-division-mode receive port of the radio-frequency transceiver, a second code-division-mode transmit port of the radio-frequency transceiver is connected to a transmit port of the second duplexer after being connected to the second radio frequency power amplifier in series, and an antenna port of the second duplexer is connected to the switch port of the switch circuit; and
    wherein the switch circuit is further configured to, in response to a frequency band switch instruction sent by the modem of the mobile terminal being received, enable an antenna port of the switch circuit and a switch port that is connected to the antenna port of the second duplexer and that is specified by the frequency band switch instruction.

3. The antenna switching system according to claim 2, wherein the radio-frequency transceiver circuit further comprises:
    a fourth radio frequency power amplifier and a second surface acoustic wave filter;
    a second time-division-mode transmit port of the radio-frequency transceiver connected to the switch port of the switch circuit after being connected to the fourth radio frequency power amplifier in series; and
    a vibration transmit port and a receive port of the second surface acoustic wave filter respectively connected to the switch port of the switch circuit and a second time-division-mode receive port of the radio-frequency transceiver.

4. The antenna switching system according to claim 3, wherein the switch circuit is further configured to:
    in response to a selection sending instruction sent by the modem of the mobile terminal being received, enable the antenna port of the switch circuit and a switch port that is connected to the fourth radio frequency power amplifier and that is specified by the selection sending instruction; and
    in response to a selection receiving instruction sent by the modem of the mobile terminal being received, enable the antenna port of the switch circuit and a vibration transmit port of the second surface acoustic wave filter specified by the selection receiving instruction.

5. The antenna switching system according to claim 1, wherein the radio-frequency transceiver circuit further comprises:
    a first duplexer;

a first radio frequency power amplifier;
a third radio frequency power amplifier;
a first surface acoustic wave filter; and
a single-pole multi-throw switch device;
wherein a receive port of the first duplexer is connected to a first code-division-mode receive port of a radio-frequency transceiver, and a first code-division-mode transmit port of the radio-frequency transceiver is connected to a transmit port of the first duplexer after being connected to the first radio frequency power amplifier in series;
wherein an antenna port of the first duplexer is connected to a switch port of the single-pole multi-throw switch device, and an antenna port of the single-pole multi-throw switch device is connected to the primary antenna;
wherein a first time-division-mode transmit port of the radio-frequency transceiver is connected to the switch port of the single-pole multi-throw switch device after being connected to the third radio frequency power amplifier in series; and
wherein a vibration transmit port and a receive port of the first surface acoustic wave filter are respectively connected to the switch port of the single-pole multi-throw switch device and a first time-division-mode receive port of the radio-frequency transceiver.

6. The antenna switching circuit according to claim 5, wherein the single-pole multi-throw switch device is configured to:
in response to a switch instruction sent by a modem of the mobile terminal being received, enable the antenna port of the single-pole multi-throw switch device and a switch port that is connected to the antenna port of the first duplexer and that is specified by the switch instruction.

7. The antenna switching circuit according to claim 5, wherein the single-pole multi-throw switch device is configured to, in response to a switch instruction sent by a modem of the mobile terminal being received, enable the antenna port of the single-pole multi-throw switch device and a switch port that is connected to the third radio frequency power amplifier and that is specified by the switch instruction.

8. The antenna switching circuit according to claim 5, wherein the single-pole multi-throw switch device is configured to, in response to a switch instruction sent by a modem of the mobile terminal being received, enable the antenna port of the single-pole multi-throw switch device and a switch port that is connected to the first surface acoustic wave filter and that is specified by the switch instruction.

9. The antenna switching system according to claim 1, further comprising P parasitic antennas comprising the parasitic antenna, and M primary antennas comprising the primary antenna, wherein P is a positive integer, wherein M is a positive integer, and wherein the switch circuit is configured to connect, in response to the parasitic antenna being used to receive or send a radio-frequency signal, the parasitic antenna and the radio-frequency transceiver circuit comprises:
in response to N channels of radio-frequency signals in different frequency bands needing to be received or sent, K switch circuits are used to separately establish connections between K parasitic antennas of the P parasitic antennas and the radio-frequency transceiver circuit, wherein M is obtained by subtracting K from N, N is a positive integer greater than 1, and P is greater than or equal to K.

10. The antenna switching system according to claim 9, wherein the switch circuit is configured to ground a second parasitic antenna of the P parasitic antennas, which is not connected to the radio-frequency transceiver circuit.

11. The antenna switching system according to claim 1, wherein the switching instruction and the primary antenna transceiver instruction are generated according to a broadcast message received by the modem from a base station.

12. The antenna switching system according to claim 11, wherein the switching instruction is indicative that the modem extracted a multichannel prompt from the broadcast message.

13. The antenna switching system according to claim 11, wherein the primary antenna transceiver instruction is indicative that the modem extracted only a primary antenna transceiver prompt from the broadcast message.

14. An antenna switching method comprising:
in response to a modem of a mobile terminal receiving a multichannel prompt sent by a base station, generating, by the modem, a switching instruction, according to the multichannel prompt, wherein the switching instruction indicates a requirement that a second channel be aggregated with a first channel, and sending the switching instruction to a switch circuit; and
in response to receiving, by the switch circuit from the modem of a mobile terminal, the switching instruction, establishing, by the switch circuit, a connection between a parasitic antenna specified by the switching instruction and a radio-frequency transceiver circuit, for the parasitic antenna to communicate a second radio-frequency signal on the second channel at a same time that a primary antenna is communicating a first radio-frequency signal on the first channel;
wherein a frequency band of the second radio-frequency signal is different from the frequency band of the first radio-frequency signal.

15. The antenna switching method according to claim 14, wherein the antenna switching method further comprises:
in response to the modem of the mobile terminal receiving a primary-antenna transceiver prompt sent by the base station, generating a primary-antenna transceiver instruction according to the primary-antenna transceiver prompt, and sending the primary-antenna transceiver instruction to the switch circuit; and
cutting off, by the switch circuit, the connection between the parasitic antenna and the radio-frequency transceiver circuit, and grounding the parasitic antenna.

16. The antenna switching method according to claim 15, wherein the antenna switching method further comprises:
establishing, by the modem of the mobile terminal by a primary antenna, connections with base stations of different frequency bands at intervals of a preset time segment;
receiving broadcast information sent by the base station;
determining whether the multichannel prompt is recorded in the broadcast information; and
determining whether the primary-antenna transceiver prompt is recorded in the broadcast information.

17. A switch circuit configured to:
connect, in response to receiving a switching instruction from a modem of a mobile terminal, a parasitic antenna specified by the switching instruction and a radio-frequency transceiver circuit, for the parasitic antenna to communicate a second radio-frequency signal on a second channel at a same time that a primary antenna is communicating a first radio-frequency signal on a first channel, wherein the switching instruction indicates a requirement that the second channel be aggregated with the first channel, and wherein a frequency band of the second radio-frequency signal is different from the frequency band of the first radio-frequency signal; and in response to receiving a primary antenna transceiver instruction from the modem indicating that the parasitic antenna is not being used to communicate the second radio-frequency signal, cut off a connection between the parasitic antenna and the radio-frequency transceiver circuit, and ground the parasitic antenna.

18. The switch circuit of claim 17, comprising:
a switch port; and
an antenna port configured to connect to the parasitic antenna, wherein the switch circuit is configured to, in response to a frequency band switch instruction sent by the modem of the mobile terminal being received, enable an antenna port of the switch circuit and a switch port that is connected to the antenna port of a duplexer and that is specified by the frequency band switch instruction.

19. The switch circuit according to claim 17, wherein the switching instruction is indicative that the modem extracted a multichannel prompt from a broadcast message received by the modem from a base station.

20. The switch circuit according to claim 17, wherein the primary antenna transceiver instruction is indicative that the modem extracted only a primary antenna transceiver prompt from a broadcast message received by the modem from a base station.

* * * * *